United States Patent [19]

Van Wyk et al.

[11] Patent Number: 5,539,309

[45] Date of Patent: Jul. 23, 1996

[54] METHOD AND APPARATUS FOR SAMPLE MONITORING

[75] Inventors: Claudius B. Van Wyk, London; Andrew Crookell, Buckinghamshire, both of England

[73] Assignee: Oxford Analytical Instruments Ltd., Oxon, United Kingdom

[21] Appl. No.: 175,506

[22] Filed: Dec. 30, 1993

[30] Foreign Application Priority Data

Jan. 8, 1993 [GB] United Kingdom ............... 9300318

[51] Int. Cl.⁶ ........................................... G01V 3/00
[52] U.S. Cl. .................................... 324/307; 324/303
[58] Field of Search ............................ 324/303, 300, 324/306, 307, 309, 312, 318

[56] References Cited

U.S. PATENT DOCUMENTS

| | | | |
|---|---|---|---|
| 4,701,705 | 10/1987 | Rollwitz | 324/306 |
| 4,714,882 | 12/1987 | Nagayama | 324/312 |
| 4,789,832 | 12/1988 | Nagayama | 324/312 |
| 5,235,276 | 8/1993 | Lew | 324/306 |

FOREIGN PATENT DOCUMENTS

| | | |
|---|---|---|
| 0367494A3 | 10/1989 | European Pat. Off. . |
| 0451962A3 | 3/1991 | European Pat. Off. . |
| WO92/16851 | 10/1992 | WIPO . |
| WO93/10468 | 5/1993 | WIPO . |

OTHER PUBLICATIONS

Composites Evaluation, Proc. of the Second Intern. Conf. on Testing, Evaluation and Quality Control of Composites–Teqc 22 Sep. 1987, Guildford, UK, pp. 23–27, G. A. Matzkanin et al. "NDE of Moisture Absorption in Composites Using Nuclear Magnetic Resonance".

Measurement and Control, vol. 22, No. 1, Mar. 1, 1989, London GB, pp. 54–55, L. Young, "Moisture Measurement Using Low Resolution Nuclear Magnetic Resonance".

Primary Examiner—Louis M. Arana

[57] ABSTRACT

Method and apparatus for monitoring a sample having 'solid' and 'liquid' content using a magnetic field generator and subjecting the sample to a static magnetic field in the first direction to cause the magnetic vectors of nuclei to precess about the first direction. Thereafter, the bulk magnetic vector of the sample is reoriented so as to gain a component in a plane orthogonal to the first direction and monitoring the resultant FID. A pulse sequence is then carried out that causes the spins of the nuclei to rephase and produce echoes from which the solid and liquid components of the sample can be defined.

11 Claims, 1 Drawing Sheet

1

METHOD AND APPARATUS FOR SAMPLE MONITORING

BACKGROUND OF THE INVENTION

1. Field of the Invention

The invention relates to methods and apparatus for monitoring samples and in particular to the monitoring of such samples using nuclear magnetic resonance (NMR) techniques. The invention is primarily concerned with relatively low resolution pulsed NMR systems and should be contrasted with other techniques which operate in frequency selective modes.

2. Description of the Related Art

Nuclear magnetic resonance relies on the fact that when certain nuclei are exposed to a uniform static magnetic field their magnetic vectors will precess around the axis of the applied magnetic field with a frequency proportional to the strength of the field. This frequency is known as the Larmor frequency and is given by the formula $n_o = yH_o$ where y is the gyromagnetic ratio of the particular nucleus and $H_o$ is the strength of the magnetic field. Alignment of the magnetic moments of the nuclei creates a bulk magnetisation vector in the sample oriented along $H_o$. If a pulse of rf energy is applied, those nuclei with spins precessing with the frequency or frequencies of the pulse can absorb the rf energy and information about the nuclei can be obtained from the subsequent relaxation and release of this energy.

Oxford Instruments manufactures and sells a product known as the QP20 which can analyse samples at a bulk level to determine properties such as bulk nuclear density, chemical characteristics such as moisture content and oil content, and physical characteristics such as viscosity and solid/liquid ratio of constituents. The concept of solid/liquid ratio determination extends to cover the discrimination of physically distinct phases where the relaxation times may be characterised as "fast" and "slow", relative to one another, typically with an order of magnitude difference. It is known to apply a single rf pulse which rotates the bulk magnetic vector of the sample by 90° from the equilibrium position (referred to as a 90° pulse) and to monitor the resulting Free Induction Decay (FID) signal and obtain information relating to the fast and slow relaxing phases of the sample in the form of a ratio. These phases will henceforth be defined as 'solid' and 'liquid' respectively although as stated previously, these descriptions may not be interpreted literally and are intended to define a relative relationship. In one example a fast relaxation rate will be less than 10 µs and a slow relaxation rate greater than 100 µs corresponding to "solid" and "liquid" phases respectively.

Two examples of systems which may be distinguished in this way are given below, with approximate relaxation rates identified:

| "Fast" or "Solid" | "Slow" or "Liquid" |
| --- | --- |
| Ice (appx. 10 us) | Pure Water (around 500 mS) |
| Crystalline Polyethylene (<10 uS) | Amorphous polyethylene (appx. 35 us) |

It will be noted that the relaxation rate of amorphous polyethylene is less than 100 µs but in the context of amorphous polyethylene/crystalline polyethylene this is relatively slow.

The problems with this process are firstly that the component of the FID due to 'liquid' varies significantly with the inhomogeneity of the main magnetic field applied to the sample, and secondly the component due to 'solid' decays very rapidly in comparison with typical instrument measurement times.

SUMMARY OF THE INVENTION

In accordance with one aspect of the present invention, a method for monitoring a sample having 'solid' and 'liquid' content, as hereinbefore defined, comprises subjecting the sample to a static magnetic field in a first direction to cause a bulk magnetization of the sample in the first direction and i) causing the bulk magnetic vector to gain a component in a second direction orthogonal to the first direction;

ii) after a first relaxation period less than the time for the 'solid' component of the resulting FID to decay to zero, causing the spins of the nuclei to rephase in such a way as to give an echo from which the 'solid' component in the sample can be determined;

iii) after a second relaxation period, following step (ii), and during which the part of the FID due to the 'solid' content of the sample decays to zero, causing the spins of the nuclei to rephase giving an echo arising from the 'liquid' component of the sample; and iv) monitoring the resultant FID signal after step (ii) and after step (iii) to obtain a measure of the 'solid' and 'liquid' content of the sample.

In accordance with a second aspect of the present invention, apparatus for monitoring a sample having 'solid' and 'liquid' content comprises a magnetic field generator for subjecting the sample to a static magnetic field in the first direction to cause the magnetic vectors of nuclei to precess about the first direction; means for reorienting the bulk magnetic vector of the sample so as to gain a component in a plane orthogonal to the first direction and for monitoring the resultant FID; and control means for causing the apparatus to carry out the steps of a method in accordance with the first aspect of the invention.

The advantage of this method and apparatus is that information about the phase composition of the sample can be obtained without reference to calibrants and without the inaccuracies inherent in extrapolation and weighting factor techniques. Also, information about the solid and liquid content of the sample can be obtained in a single sequence and relatively quickly compared with the known techniques.

The steps of changing the orientation of the bulk magnetic vector could be carried out by imposing gradient magnetic fields on the sample in order to change the magnetic field in the vicinity of the nuclei but is preferably carried out by applying pulses of rf electromagnetic energy to the sample.

Typically, the first relaxation period is less than 25 µs, preferably in the range 1–15 microseconds while the second relaxation period is typically greater than 25 µs, preferably at least 70 µs.

Typically, the step of monitoring the 'solid' component comprises monitoring the FID signal immediately following step i); monitoring the FID signal following step ii) from the point at which the FID signal is at a maximum and thereafter over a period of time corresponding to the duration of step i); and thereby obtaining the value of the FID signal at the beginning of step i).

Preferably, the step of monitoring 'liquid' content comprises monitoring the FID signal immediately before step iii); monitoring the FID signal following step iii) from the point at which the FID signal is maximum and thereafter over a period of time corresponding to the combined duration of steps i) and ii); and thereby obtaining the value of the "liquid" signal at the beginning of step i).

It will be understood that not only is the invention usable with low resolution apparatus but it could also be used with high resolution apparatus with much higher strength static magnetic fields.

BRIEF DESCRIPTION OF THE DRAWINGS

An example of a method and apparatus according to the invention will now be described with reference to the accompanying drawings in which.

DESCRIPTION OF THE PREFERRED EMBODIMENTS

Figure 1:
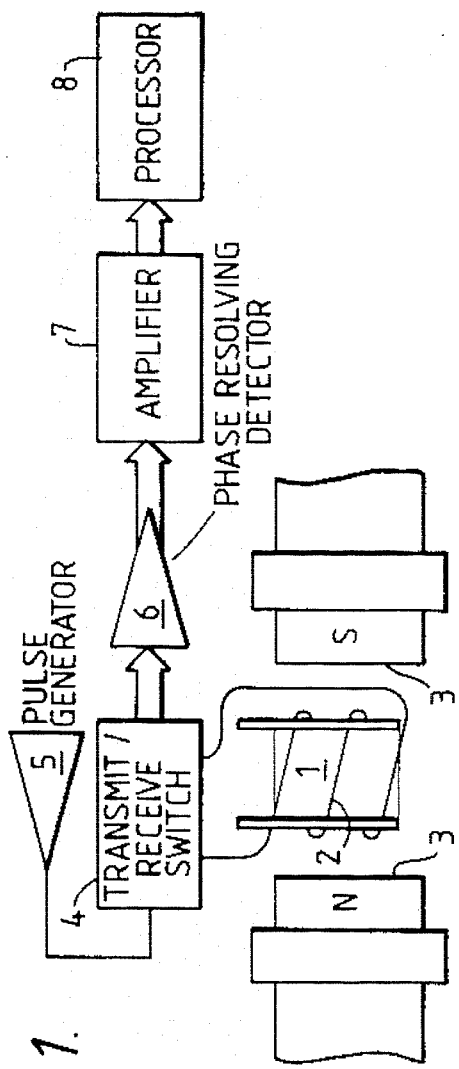
FIG. 1 is a schematic block diagram of a sample monitoring apparatus in accordance with a preferred embodiment of the present invention; and, FIG. 2 is a graph showing a pulse sequence.

Reference will now be made in detail to the present preferred embodiments of the present invention, examples of which are illustrated in the accompanying drawings, wherein like reference numerals refer to like elements throughout.

FIG. 1 illustrates an example of the apparatus on which the present method can be practiced The apparatus shown in FIG. 1 is based, in part, on the apparatus described in more detail in GB-A-2053481. A sample region 1, which contains a static or flowing sample, is surrounded by a coil 2 placed between the poles 3 of a powerful magnet, with a strength less than 1T, the direction between the poles 3 lying on a z axis. The coil 2 is aligned with a y axis, and can act either as a receiving coil or as a transmitting coil by virtue of a transmit/receive switch 4. The coil 2 is capable of transmitting rf pulses from a pulse generator 5 which reorient the magnetic moments of the nuclei so as to gain a component in an x and/or a y direction where x, y, and z are mutually orthogonal axes. The output from a phase resolving detection system 6, such as a quadrature detector, constitutes the FID signal which is processed by an amplifier 7 and microprocessor 8.

Figure 2:
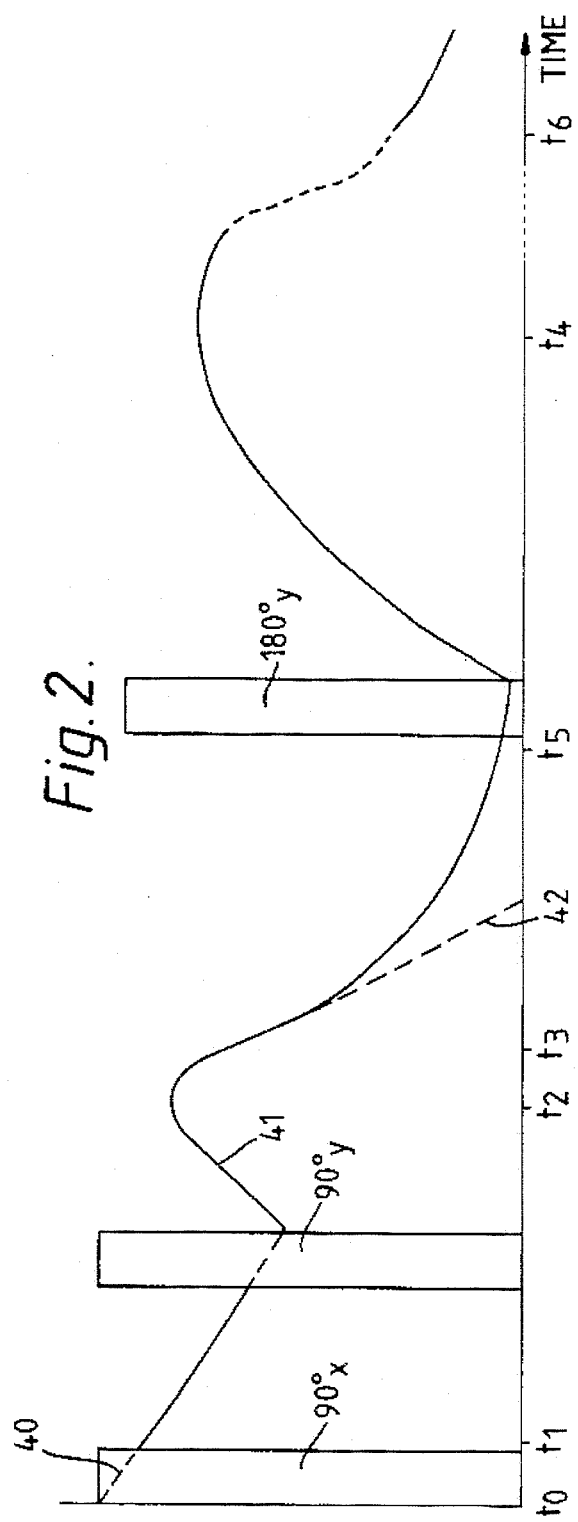

FIG. 2 illustrates a typical example of a pulse sequence used to determine the 'solid' and 'liquid' content of a sample in the sample region 1. Initially, the coil 2 is energised to generate a 90° rf pulse in the x direction. This initiates a free induction decay (FID) signal 40 which contains contributions from the 'solid' and 'liquid' components of the sample. The 'solid' and 'liquid' contents are related to the value of the FID signal at time t0 denoted as F(t0) by the relationship $$F(t0)=S(t0)+L(t0)$$

where S(t0) is the signal at time t0 arising solely from the 'solid' component and L(t0) is the signal at time t0 arising solely from the 'liquid' component.

F(t0) cannot be measured directly because of the dead time of the receiver after the RF pulse. Instead, the signal received by the coil 2 (in the y direction) is monitored at time t1 as soon as possible after the completion of the 90 degree pulse and the value F(t1) recorded. Typically, the time t1 is in the order of 10 microseconds after t0.

After a period typically less than 25 microseconds after the completion of the first 90 degree pulse, the coil 2 is energised to generate a second 90 degree pulse in the y direction which causes the spins to rephase generating an FID echo as shown at 41. The intensity of this echo at its maximum F(t2) is determined and then the intensity of the FID at time t3 is determined F(t3). Both F(t2) and F(t3) are detected by the coil 2 in the y direction. The time t3 is set to be the same interval after time t2 as the time t1 is after the time t0. This is because the profile of the FID from the maximum echo value at t2 to the time t3 is the same as the profile for the period t0–t1.

Calculation of the contribution to the FID from the 'solid' component requires the contribution from the 'liquid' component to be subtracted:

$$S(t1)=F(t1)-L(t1)$$

$$S(t2)=F(t2)-L(t2)$$

$$S(t3)=F(t3)-L(t3)$$

Then S(t0) can be calculated using the formula:

$$S(t0)/S(t1)=S(t2)/S(t3)$$

The liquid components are calculated using the method described below.

The component of the FID due to 'solid' material decays away relatively rapidly as shown by the dashed line 42. Thereafter, the FID is due solely to the 'liquid' content of the sample and to measure this, a 180° pulse is generated by the coil 2 in the y direction after a period following the previous 90° pulse which guarantees that the 'solid' component has decayed to zero. This will be at least 25 microseconds, typically 70 microseconds. The 180° pulse causes the spins to rephase and thereby causes an echo in the FID whose maximum value is independent of any inhomogeneities in the applied magnetic field. The 'liquid' component can thus be determined by measuring and calibrating the maximum value of the FID signal at time t4, L(t4).

As an alternative to calibration, the FID signal can be measured at a time t5 immediately preceding the 180 degree pulse (L(t5)), at the time t4 at which the echo reaches a maximum (L(t4)), and at a subsequent time t6 which is defined such that the period t4–t6 is equal to the period t0–t5 (L(t6)).

A method similar to that described above for determining the 'solid' content is then used to determine a value for the 'liquid' contribution to the FID signal at the time t0,L(t0).

$$L(t0)/L(t5)=L(t4)/L(t6)$$

Where the relaxation of the 'solid' component occurs very much faster than the relaxation of the 'liquid' component, the 'liquid' component will not decay significantly in the time period t0 to t3 and the approximation $$L(t1)=L(t2)=L(t3)=L(t0)$$

can be made.
Thus, $$S(t0)/(F(t1)-L(t0))=(F(t2)-L(t0))/(F(t3)-L(t0))$$

Typically, signal values at each time ($t_0$–$t_6$) are determined by monitoring a number of points around each time (typically at 1 microsecond intervals) and averaging those values.

In addition, the pulse sequence is preferably repeated using a phase cycling technique which reduces the problems of DC offsets and noise.

A typical phase cycle (including the sequence just described above) would be as follows:

Sequence 1: $90_{+x}$, $D_{+y}$; $90_{+y}$, $D_{+y}$; $D_{+y}$; $180_{+y}$, $D_{+y}$ Sequence 2: $90_{-x}$, $D_{-y}$; $90_{-y}$, $D_{-y}$; $D_{-y}$; $180_{-y}$, $D_{-y}$ Sequence 3: $90_{+y}$, $D_{-x}$; $90_{-x}$, $D_{-x}$; $D_{-x}$; $180_{-x}$, $D_{-x}$ Sequence 4: $90_{-y}$, $D_{+x}$; $90_{+x}$, $D_{+x}$; $D_{+x}$; $180_{+x}$, $D_{+x}$ D indicates a detection operation with the subscript indicating the direction in which the signal is detected.

It should be understood that although this sequence has been described in terms of 90° and 180° pulses of rf energy, similar results could be achieved by the use of composite rf pulses having a net effect equivalent to 90° or 180° pulses, or by changes to the magnetic field applied to the sample so as to cause appropriate reorientation of the bulk magnetic vector. In addition, angles different from 90° and 180° could be used by constructing a suitable pulse sequence.

We claim:

1. A method for monitoring a sample having 'solid' and 'liquid' content, the method comprising subjecting said sample to a static magnetic field in a first direction to cause a bulk magnetization of said sample in said first direction defining a bulk magnetic vector and i) causing the bulk magnetic vector to gain a component in a second direction orthogonal to the first direction;

ii) after a first relaxation period less than the time for the 'solid' component of the resulting FID to decay to zero, causing the spins of the nuclei to rephase in such a way as to give an echo from which the 'solid' component in the sample can be determined;

iii) after a second relaxation period, following step (ii), and during which the part of the FID due to the 'solid' content of the sample decays to zero, causing the spins of the nuclei to rephase giving an echo arising from the 'liquid' component of the sample; and iv) monitoring the resultant FID signal after step (ii) and after step (iii) to obtain a measure of the 'solid' and 'liquid' content of the sample.

2. A method according to claim 1, wherein the changes in orientation of the magnetic vectors of the nuclei are effected by applying pulses of electromagnetic energy to the sample.

3. A method according to claim 2, wherein step i) comprises applying a 90° rf pulse to the sample, and step ii) comprises applying another 90° rf pulse to the sample, and step iii) comprises applying a 180° rf pulse to the sample and wherein the two 90° rf pulses are applied in mutually orthogonal directions.

4. A method according to claim 3, wherein the application of 90° and 180° pulses is effected by composite pulses which have the nett effect of a 90° and 180° reorientation of the bulk magnetic vector respectively.

5. A method according to claim 1, wherein said first relaxation period is less than 25 microseconds.

6. A method according to claim 5, wherein said first relaxation period is in the range 1–10 microseconds.

7. A method according to claim 1, wherein said second relaxation period is at least 25 microseconds.

8. A method according to claim 7, wherein said second relaxation period is about 70 microseconds.

9. A method according to claim 1, wherein the step of monitoring the 'solid' component comprises monitoring the FID signal immediately following step i); monitoring the FID signal following step ii) from the point at which the FID signal is at a maximum and thereafter over a period of time corresponding to the duration of step i); and thereby obtaining the value of the FID signal at the beginning of step i).

10. A method according to claim 1, wherein the step of monitoring 'liquid' content comprises monitoring the FID signal immediately before step iii); monitoring the FID signal following step iii) from the point at which the FID signal is maximum and thereafter over a period of time corresponding to the combined duration of steps i) and ii); and thereby obtaining the value of the "liquid" signal at the beginning of step i).

11. Apparatus for monitoring a sample having 'solid' and 'liquid' content, the apparatus comprising a magnetic field generator for subjecting the sample to a static magnetic field in a first direction to cause the magnetic vectors of nuclei to precess about said first direction;

means for reorienting the bulk magnetic vector of the sample so as to gain a component in a plane orthogonal to said first direction and for monitoring the resultant FID; and control means for:

i) causing said bulk magnetic vector to gain a component in a second direction orthogonal to the first direction;

ii) after a first relaxation period less than the time for the 'solid' component of the resulting FID to decay to zero, causing the spins of the nuclei to rephase in such a way as to give an echo from which the 'solid' component in said sample can be determined;

iii) after a second relaxation period, following step (ii), and during which the part of the FID due to the 'solid' content of the sample decays to zero, causing the spins of the nuclei to rephase giving an echo arising from the 'liquid' component of the sample; and iv) monitoring the resultant FID signal after step (ii) and after step (iii) to obtain a measure of the 'solid' and 'liquid' content of the sample.

* * * * *